United States Patent [19]

Miller

[11] Patent Number: 4,703,133
[45] Date of Patent: Oct. 27, 1987

[54] ELECTROMAGNETIC SHIELD

[76] Inventor: John S. Miller, 8023 Naylor Avenue, Los Angeles, Calif. 90045

[21] Appl. No.: 870,899

[22] Filed: Jun. 5, 1986

[51] Int. Cl.$^4$ ............................................. H05K 9/00
[52] U.S. Cl. ................................ 174/35 GC; 361/424
[58] Field of Search .................. 174/35 GC, 35 C, 36; 339/143 R; 200/305; 219/10, 55 D; 361/424

[56] References Cited

U.S. PATENT DOCUMENTS

| | | | |
|---|---|---|---|
| 3,502,784 | 3/1970 | Kunkel | 174/35 GC |
| 3,505,463 | 4/1970 | McAdams | 174/35 GC |
| 3,739,076 | 6/1973 | Schwartz | 174/78 |
| 4,033,654 | 7/1977 | Ross | 339/143 R |
| 4,131,329 | 12/1978 | Flatt | 339/111 |
| 4,239,318 | 12/1980 | Schwartz | 339/143 R |
| 4,441,780 | 4/1984 | Walters | 339/143 R |
| 4,512,623 | 4/1985 | Tomsa | 339/143 R |

OTHER PUBLICATIONS

Transfer Impedance Approach to EMP Cable Shield Testing, J. S. Miller, Los Angeles Division, Rockwell International, 10/19/77.

Primary Examiner—Grimley, Arthur T.
Assistant Examiner—David A. Tone
Attorney, Agent, or Firm—Pretty, Schroeder, Brueggemann & Clark

[57] ABSTRACT

An electromagnetic shield for shielding against electromagnetic interference, in a manner similar to a solid metal shield having a thickness of several skin depths. In all of the disclosed embodiments, a plurality of electrically-conductive closed rings or loops are arranged in a predetermined relationship, to conduct current inducted by electromagnetic energy received from an exterior interference source or an interior signal source. The special ring or loop configuration causes the induced current to concentrate in the portions of the rings closest to a surface adjacent to the source of the electromagnetic energy, to enhance the shielding. One set of embodiments is suitable for use in a sheet material for housings or enclosures, while another set is suitable for use in the joints between mating coaxial conductors or between adjacent sheets of metal. Still another embodiment is suitable for use as a flexible or rigid cable shield.

19 Claims, 11 Drawing Figures

ELECTROMAGNETIC SHIELD

BACKGROUND OF THE INVENTION

This invention relates generally to shields for electromagnetic interference, and, more particularly, to shields that perform in a manner similar to solid metal, but that include substantial amounts of lighter, non-metallic material.

Electromagnetic shields are customarily used for electrical circuitry that must be operated in an environment where significant electromagnetic interference is present. Such shields are also used to keep internally-generated electromagnetic energy from being transmitted outwardly. Basic requirements for the shield are that it prevent significant energy penetration and that it provide a low-impedance path for the electrical current induced in it by the electromagnetic energy, whether that energy is generated externally or internally.

The most common electromagnetic shield is a continuous metal sheet enclosure. Although such an enclosure is effective in preventing externally-generated or internally-generated electromagnetic energy from passing through it, its weight and fabrication costs are considered to be excessive in many applications. Metal enclosures are also subject to corrosion in many environments. Only a small thickness is required for a solid metal shield to achieve the so-called skin effect, which causes the induced rf current to be conducted close to the shield's surface. However, the shield must ordinarily be substantially thicker than the skin depth to provide the desired structural strength. In addition, the joints between adjacent solid metal shields can sometimes allow leakage of electromagnetic energy. This is a particular problem when the amount of energy to be shielded against is large, or when low-level information signals are being conducted.

Efforts have been made in the past to reduce the weight and corrosiveness of metallic shielding by using a composite structure that includes bits of metal suspended in a predetermined relationship to each other in a lightweight, non-metallic binder material. Sufficient metal bits are included to ensure that they are in general contact with each other and thus provide a path for the electrical current induced by the electromagnetic energy. Although such composite structures are generally considered effective in shielding against some static forms of electromagnetic energy, they are not believed to prevent significant energy penetration, especially at high frequencies.

A special problem of the electromagnetic shielding occurs at the interface between two separate shields. This is of particular importance in electrical connectors between two overlapping, coaxial cylindrical conductors. The two cylindrical conductors typically have been electrically connected to each other by a coil spring wrapped into a toroidal shape and compressed between their two confronting surfaces. Such a shield coupling is generally considered effective at conducting electrical current from one cylindrical conductor to the other, with relatively low resistance and inductance. In addition, the spring's resilience ensures that contact is continuously made between the two conductors, even if they are not precisely concentric. It is believed, however, that the shielding provided by such a coil spring between two coaxial conductors can be further improved.

SUMMARY OF THE INVENTION

The present invention is embodied in a lightweight electromagnetic shield that includes a plurality of closed, electrically-conductive rings arranged by binder means in a predetermined relationship to each other, to shield against electromagnetic energy in a manner comparable to a solid metal shield. The electromagnetic energy is received by the shield from a source located adjacent to an outer surface, which can be on either side of the shield. This energy induces an electrical current to flow through the rings in a predetermined direction adjacent to, and parallel to, the outer surface of the shield. At frequencies above the skin depth of the rings, the presence of a return path opposite the outer surface causes more of the source-induced current to flow through the ring portions nearest the outer surface than through the portions furthest from the surface. This current imbalance electromagnetically induces an oppositely-directed current in the portion of the ring furthest from the surface, which bucks the source-induced current in the latter ring portion and thus further reduces the magnitude of current flowing through it. Consequently, the magnitude of the current flowing through the ring portions nearest the outer surface is increased and the electromagnetic shielding provided by the shield is correspondingly enhanced.

One embodiment of the invention is suitable for use in an electrical connector in which two cylindrical and coaxial conductors are connected together. The two conductors overlap each other, with one being larger than the other such that a uniform annular space is formed between them. The plurality of electrically-conductive rings are preferably circular and arranged in this annular space in a spaced-apart relationship, with the plane of each ring aligned with the axes of the two coaxial conductors. The rings therefore form a toroidal shield, with each ring including a semicircular outer leg and a semicircular inner leg interconnecting the confronting surfaces of the two conductors.

Electromagnetic energy received from a source located either outside or inside the two conductors induces an electrical current to flow axially along the two conductors and through the semicircular legs of the intervening rings. At frequencies above the skin depth of the rings, magnetic flux coupling exceeds resistive distribution and causes more of the source-induced current to flow through the legs nearest the source than the opposite legs, furthest from the source. This current imbalance electromagnetically induces a oppositely-directed current in the opposite legs, which bucks the source-induced current flowing in the opposite legs. This reduces the magnitude of current flowing in the opposite legs and correspondingly enhances the electromagnetic shielding the rings provide.

In this embodiment of the invention, the plurality of rings can be maintained in their toroidal shape by several alternative means. One such means includes a metallic strip interconnecting the rings along on side of the toroid. In this case, the rings and strip can conveniently be formed by cutting transverse slots through all but one side of a metallic tube and then bending the slotted tube into the desired toroidal shape. Alternatively, the rings can be held in their toroidal shape by means of a compressible, non-conducting binder extending through the open centers of the rings. The toroidal arrangement of rings can be seated in an annular recess formed in the confronting surface of either or both of the two conductors. In addition, significantly enhanced shielding can be achieved by providing a second, identical arrangement of rings in the annular space between the two conductors, adjacent to the first set of rings. The second toroidal shield provides shielding in a manner comparable to a solid metal shield having a thickness of two or more skin depths. Additional toroidal shields might be needed in some applications.

In other embodiments of the invention, the two conductors can have non-circular cross-sections or can even be planar. In these embodiments, the plurality of rings are arranged in a uniform space between the two conductors, with the plane of each ring arranged substantially perpendicular to the two conductors, at their respective points of contact.

In still other embodiments of the invention, the electromagnetic shield has a configuration that presents a generally planar surface toward the source of electromagnetic energy. These embodiments are specially suited for use as a sheet material for housings or enclosures. In one such embodiment, the plurality of rings are distributed substantially randomly in a non-electrically-conductive binder means and in a sufficiently high concentration to ensure that a majority of the rings are in electrical contact with each other. In an alternative embodiment, the rings are distributed in the binder means with their planes substantially parallel to each other and perpendicular to the surface that faces the source. This latter embodiment is suitable for use in environments where any source-induced current is known to travel only along substantially one axis.

The plurality of rings also can be interlocked with each other in two dimensions, like mail. In embodiments where flexibility is not required, the rings are preferably welded together, to reduce contact resistance and thereby provide lower impedance for any source-induced current. In embodiments where flexibility is required, on the other hand, an electrically-conductive braid can overlay the interlocked rings, to provide a low-impedance dc current path and magnetically couple to shorted rings that buck the penetrating energy.

In still another embodiment, each ring is a segment of a structure that includes two or more planar, substantially equal-sized rings connected to each other and having a common diameter. In this embodiment, each such structure is more likely to be oriented to conduct the induced current than would be a single, randomly-oriented ring.

Other aspects and advantages of the present invention will become apparent from the following description of the preferred embodiments, taken in conjunction with the accompanying drawings, which illustrate, by way of example, the principles of the invention.

DESCRIPTION OF THE PREFERRED EMBODIMENTS

Figure 1:
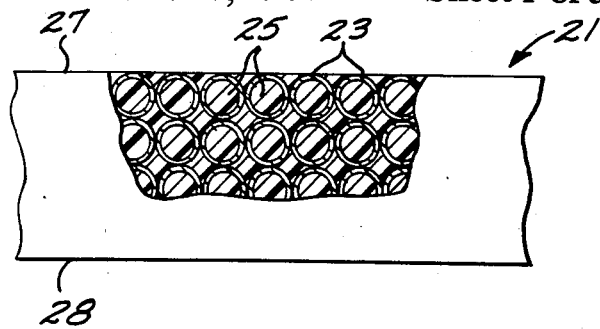
FIG. 1 is a cross sectional view of a planar electromagnetic shield constructed in accordance with one preferred embodiment of the invention, with a plurality of electrically-conductive rings arranged along parallel axes in the shield and in adjacent contact with each other.

With reference now to the drawings and particularly to FIG. 1, there is shown a segment of a lightweight, planar shield 21 that shields against impinging electromagnetic energy substantially similar to a shield of solid metal. The shield includes a plurality of substantially uniform, electrically-conductive rings 23 that are held in a predetermined relationship to each other by a binder 25 that is formed of a non-conductive plastic material such as epoxy. The rings are all arranged so as to electrically contact adjacent rings and provide an electrical current path generally parallel to an outer surface 27. Although the surface 27 is called an outer surface, it will be appreciated that the shield will function similarly if the source of the electromagnetic energy is located inside the shield and the surface 27 were called an inner surface. The shield is substantially lighter than an equivalent shield of solid metal, yet its special configuration provides an electromagnetic shielding that is recognized in theory, but untested in practice for flat sheets and cable shields.

If electromagnetic interference impinges on the shield 21 from the space adjacent to the outer surface 27, an electrical current is induced to flow through the shield, parallel to the surface. The shield functions to prevent significant interference from reaching the space adjacent the opposite, inner surface 28. This shielding is enhanced if the induced current is made to flow as close to the outer surface as possible, with minimal current flowing near the inner surface.

Figure 2:
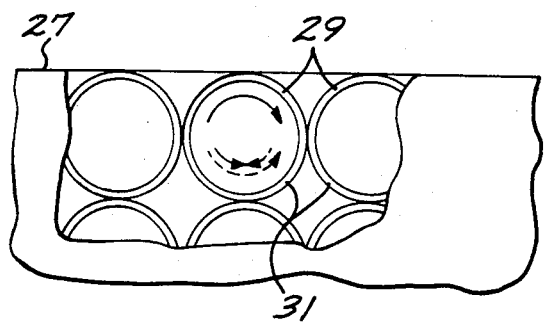
FIG. 2 is a schematic diagram showing how the electrically-conductive rings in the shield of FIG. 1 operate to provide enhanced electromagnetic shielding.

The theoretical basis for the enhanced effectiveness of the shield 21 of the invention is better understood with reference to FIG. 2. It will be observed that each depicted ring 23 includes an upper semicircular leg 29, nearer the outer surface 27, and a lower semicircular leg 31, nearer the opposite, inner surface 28. If the source-induced current is assumed to flow from left to right in FIG. 2, it will be appreciated that, at low frequencies, the current will tend to flow equally in both the upper leg 29 and lower leg 31 of each ring. At high frequencies, above the ring's skin depth, on the other hand, the current diminishes in intensity with increased distance into the shield. This is because the electromagnetic field is diminished by an imbalance of the induced current, producing back emf. This diminishment is what brings about the shielding.

At frequencies above the skin depth, the larger left-to-right current flowing in the upper leg 29 of each ring 23 will create an electromagnetic field vector that is oriented directly into the paper, through the opening of the ring. This field tends to induce an oppositely-directed (i.e., right-to-left) current in the ring's lower leg 31. This oppositely-directed current bucks the source-induced current, to reduce the absolute magnitude of current flowing through the lower leg and thus enhance the shielding provided by the shield 21. All of the rings distributed throughout the shield function in this same fashion.

It should be noted that the plurality of rings 23 in the shield 21 of FIG. 1 are all arranged in a coplanar orientation. The shield, therefore, functions most effectively in the manner described only when source-induced current flows in the direction of the rings' plane. The more transverse the flow of source-induced current, the less effective the shielding.

It should also be noted that the rings 23 need not be precisely circular and need not all be the same size. Although a circular shape is believed to provide the most efficient shielding, other open centered shapes (e.g., oval or even square) would also be effective.

Figure 3:
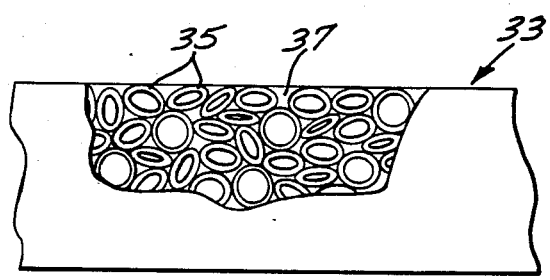
FIG. 3 is a cross sectional view similar to FIG. 1, but of an alternative embodiment in which the plurality of electrically-conductive rings are distributed substantially randomly in the shield.

FIG. 3 depicts a shield 33 that is more effective than the shield 21 of FIG. 1 in shielding against electromagnetic interference that induces a current to flow in an unspecified or random direction. In the FIG. 3 embodiment, a plurality of rings 35 are distributed substantially randomly throughout a non-conductive plastic binder 37. Sufficient rings are included to ensure that at least a majority of them are in electrical contact with adjacent rings. Regardless of the direction in which the interference current is induced to flow, the randomly-distributed rings will provide an appropriate current path. The same electromagnetically-induced bucking current phenomenon described above will occur here, to enhance the shielding. By contrast, a shield containing randomly placed metal bits will not exhibit the current bucking effect, and the current distribution is governed principally by just the return path effect on each individual bit.

Figure 4:
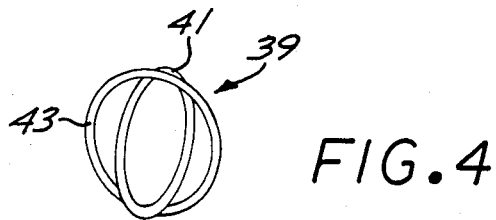
FIG. 4 is a perspective view of an alternative ring structure that can be substituted for the rings of FIGS. 1 and 3.

FIG. 4 depicts an alternative ring structure 39 that can be used in place of the rings 35 in the embodiment of FIG. 3. The structure of FIG. 4 includes two planar rings 41 and 43 of equal diameter arranged substantially perpendicular to each other and with a common diameter. A plurality of such ring structures can be distributed uniformly in an epoxy binder to produce a shield similar to those of FIGS. 1 and 3. Thus, regardless of the direction of the induced current, at least one of the two semicircular legs in each ring structure will likely be more closely aligned with that direction than would the rings of the FIG. 3 shield. The resulting current path is, therefore, more direct and provides a lower impedance.

The rings 23 and 35 of FIGS. 1 and 3, respectively, can be produced conveniently by performing a series of transverse cuts through a metallic tube. The ring structure 39 of FIG. 4, on the other hand, is best produced by casting or by welding together rings and half-rings.

Figure 5:
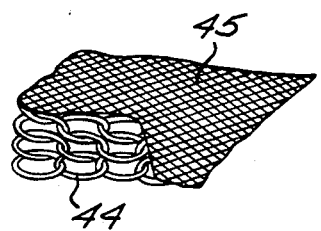
FIG. 5 is a is a perspective view of an embodiment of the invention that includes an interlocked, two-dimensional array of rings.

Still another embodiment of the invention is depicted in FIG. 5. It includes a two-dimensional array of interlocked, electrically-conductive rings in the form of mail 44. Each vertically-oriented ring functions in the manner described above to shield against electromagnetic interference. In applications where shield flexibility is not required, the rings of the mail can be welded together, to reduce contact resistance. On the other hand, in applications where shield flexibility is required, the mail can be overlayed by a wire braid 45, to provide a low-impedance dc current path in both longitudinal and circumferential toroidal directions.

Figure 6:
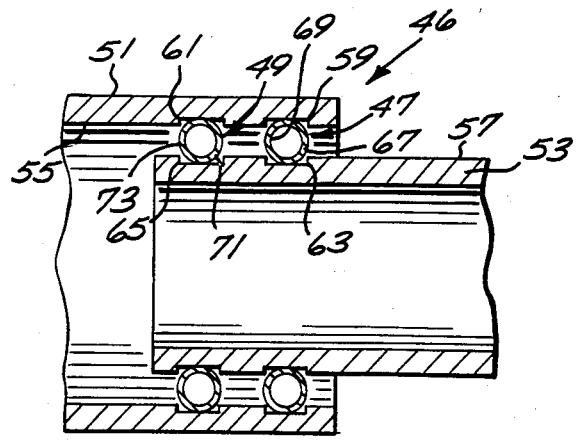
FIG. 6 is a cross sectional view of a portion of an electrical connector that includes still another embodiment o the invention, this one being in the form of two toroidal shields for shielding against the penetration of electromagnetic energy at the interface between two substantially cylindrical and coaxial conductors.
Figure 7:
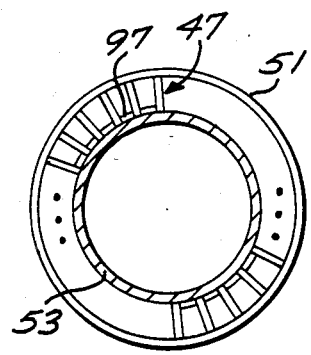
FIG. 7 is an end view of the structure of FIG. 6.

The enhanced electromagnetic shielding provided by the special ring structure can also be utilized advantageously in a connector between two coaxial transmission lines. A portion of such a connector 46 is depicted in FIGS. 6 and 7. The connector includes two ring-containing toroidal-shaped shields 47 and 49 at the interface between two cylindrical and coaxial conductors 51 and 53. One conductor 51 has a slightly larger diameter than the other conductor 53, and it overlaps the latter by a short distance, as shown. A thin annular space is thereby formed between the confronting surfaces 55 and 57 of the respective overlapping conductors. The two toroidal shields 47 and 49 are located side-by-side in this space, and each includes a plurality of spaced-apart, electrically-conductive rings arranged to be coplanar with the shield's central axis. The rings in each toroidal shield are spaced substantially evenly around the toroid's circumference, as best observed in FIG. 7.

The two toroidal shields 47 and 49 are seated in their prescribed positions in annular grooves 59 and 61 formed in the confronting, inside surface 55 of the outer conductor 51 and in corresponding annular grooves 63 and 65 formed in the confronting, outside surface 57 of the inner conductor 53. These grooves prevent the two toroidal shields from being inadvertently moved axially relative to the two conductors. The rings are sized relative to the annular space defined between the two sets of grooves such that they are slightly compressed when in their prescribed positions. This ensures that the rings make continuous electrical contact with the two conductors 51 and 53 and thereby minimizes impedance. Longitudinal contact resistance and circular contact resistance, which are significant problems in prior configurations that utilize coil springs, are substantially reduced or eliminated by the configuration of FIGS. 6 and 7.

The two toroidal shields 47 and 49 function to prevent significant electromagnetic energy supplied by an adjacent source (either internal or external) from reaching the opposite side of the two conductors 51 and 53, by providing a low impedance current path from one conductor to the other. Thus, source-induced current traveling axially along one conductor is conducted through the two shields to the other conductor, where it continues in the same axial direction.

The rings of the outer toroidal shield 47, i.e., the rightmost shield in FIG. 6, each include an outer semicircular leg 67 and an inner semicircular leg 69. Similarly, the rings of the inner toroidal shield 49, i.e., the leftmost shield in FIG. 6, each include an outer semicircular leg 71 and an inner semicircular leg 73. All of these legs combine to conduct the source-induced current from one cylindrical conductor 51 or 53 to the other.

The shielding provided by the two toroidal shields 47 and 49 is enhanced to the extent any source-induced current is carried more by the semicircular legs of the rings that are nearest the source. Thus, shielding against electromagnetic energy received from outside the conductors 51 and 53 is enhanced if more induced current is carried by the right legs in FIG. 6, whereas shielding against energy received from inside the conductors is enhanced if more induced current is carried by the left legs. The continuous metal ring configuration helps achieve this goal, at least with respect to frequencies above the skin depth of the rings.

Figure 8:
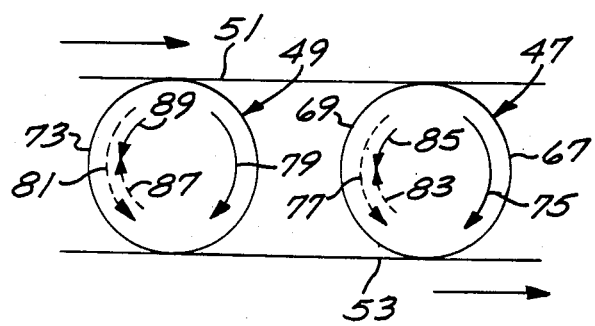
FIG. 8 is a schematic diagram depicting the various paths and magnitudes of interference current, having a frequency above the skin depth, which is conducted along the coaxial conductors of FIG. 6 and through the two semicircular legs of each ring of the two toroidal shields.

More particularly, and with reference to the schematic diagram of FIG. 8, which could represent a connection between any two conductors having confronting surfaces, it will be observed that the left-to-right source-induced current tends to flow downwardly through all four semicircular legs 67, 69, 71 and 73 of the two toroidal shields 47 and 49. The source-induced current through these four legs is indicated by the respective reference numerals 75, 77, 79 and 81. At frequencies above the skin depth of the rings, the return path 82 causes this current to flow more through the legs furthest to the right in the figure. The currents 75, 77, 79 and 81 are, therefore, depicted to have successively smaller magnitudes. When two or more toroidal shields are used, this effect increases with increasing frequency.

The downward current 75 through the outer legs 67 of the outer shield 47 creates an electromagnetic field passing through the central aperture of the depicted ring, and, indeed, through the core of the entire toroidal shield. This field tends to induce an upwardly-directed current 83 in the inner leg 69 of the same ring, and, similarly, in the inner legs of all of the shield's rings. A low frequency, cumulative effect would be achieved with a magnetic toroidal core, subject to the response of its material. This upwardly-directed current bucks the downwardly-directed, source-induced current 77 and thus reduces the absolute magnitude of current flowing through the various inner legs. The resulting net current is represented by the reference numeral 85.

The same phenomenon occurs in the inner toroidal shield 49. In particular, downwardly-directed current 79 flowing through the outer semicircular leg 71 electromagnetically induces an upwardly-directed current 87 in the inner semicircular legs 73, which bucks the source-induced current 81 flowing through the inner legs. The net current through the inner legs is represented by the reference numeral 89.

The special toroidal shield configuration results in successively diminished currents (at frequencies above the rings' skin depth) flowing downwardly through the ring's semicircular legs 67, 69, 71 and 73, as they are located progressively further from the connector's exterior. That is, the outer leg 67 of the outer toroidal shield carries the most source-induced current, while the inner leg 73 of the inner shield 49 carries the least. With only minimal current flowing through the leg 73 adjacent the interior of the two conductors 51 and 53, electromagnetic shielding is optimized, at least for frequencies above the rings' skin depth. The skin depth of a conductive material is proportional to resistivity divided by both permeability and frequency. Minimizing the ratio of resistivity to permeability will minimize skin depth, but might maximize dc resistance, which reduces shielding at low frequencies, i.e., frequencies below the skin depth.

The use of two or more toroidal shields, such as the shields 47 and 49, provides a shielding response that increases with frequency, similar to that provided by a shield of solid metal having a thickness of two or more skin depths. Upper frequency limits are related to ring size, which can be minimized as needed to provide effective shielding that actually increases with increasing frequency, up to some required limit. By contrast, the use of just a single toroidal shield would provide a shielding response that remains generally constant with increasing frequency, up to its size limit, similar to one skin depth of solid metal. This flat response evident in the test data relies on the flat response of contact resistance, as well as the flat response of the changing resistance and current density of the ring, itself.

Forming each of the toroidal shields 47 and 49 as a series of generally planar rings having their planes aligned with the axes of the two coaxial conductors 51 and 53 provides substantially improved shielding over that afforded by coil springs wrapped into the same toroidal shape. Such prior uses of coil springs are considered inferior because the electromagnetic coupling between the two semicircular legs of each loop is impeded by two points of contact resistance and, therefore, is not as complete as it would be if the two legs formed a closed metallic circle. Moreover, depending on the pitch of the coil spring, the source-induced current undergoes a greater change in direction and thus encounters a higher impedance.

Figure 9:
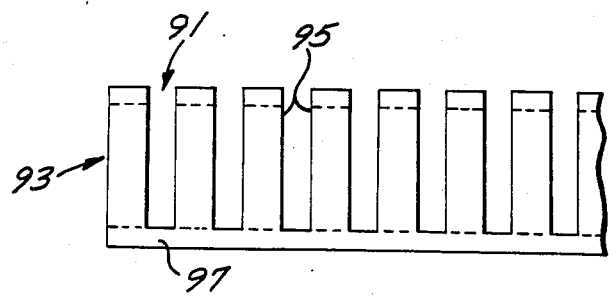
FIG. 9 is a side view of a slotted tube that can be bent into a toroidal shape to form either of the two toroidal shields of FIG. 6.
Figure 10:
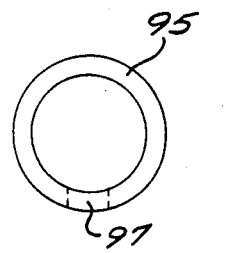
FIG. 10 is an end view of the slotted tube of FIG. 9.

One preferred technique for forming the toroidal shields 47 and 49 of FIGS. 6 and 7 is described with reference to FIGS. 9 and 10. Transverse, parallel slots 91 are made nearly completely through a metallic tube 93 to produce an elongated series of parallel rings 95 joined together by a thin strip 97 along one side of each ring. This slotted tube is then bent into the toroidal shape of FIGS. 6 and 7, with the thin strip 97 that joins the rings together facing radially inwardly, as shown.

Figure 11:
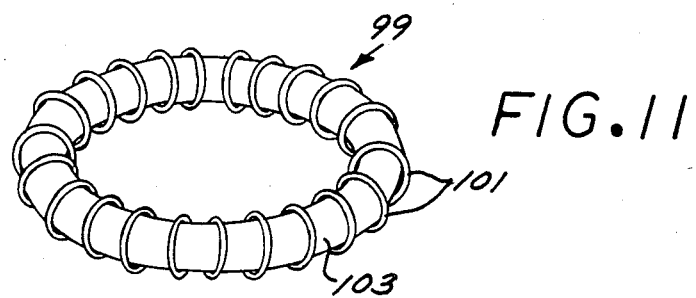
FIG. 11 is a perspective view of an alternative toroidal shield embodiment that can be substituted for the slotted tube shield of FIGS. 6–7.

An alternative toroidal shield 99 is depicted in FIG. 11 This shield includes a series of separate electrically-conductive rings 101 held in their predetermined relationship by a compressible, non-electrically-conductive core 103. The compressibility of the core is selected to permit the rings to be compressibly deformed with appropriate contact pressure in the annular space between the two cylindrical conductors, which is desirable to enhance electrical contact with the two conductors and thus minimize contact resistance.

It should be appreciated from the foregoing description that the present invention provides an improved structure for shielding against electromagnetic interference. In all of the disclosed embodiments, a series of electrically-conductive rings or continuous loops provide a low impedance current path for any source-induced current, with the special ring or loop structure causing, at frequencies above skin depth, a maximum proportion of the current to be conducted nearest the source of the interference, and thus away from the space to be shielded.

Although the invention has been described in detail with reference to the presently preferred embodiments, those of ordinary skill in the art will appreciate that various modifications can be made without departing from the invention. Accordingly, the invention is defined only by the following claims.

I claim:
1. An electromagnetic shield comprising:
   a plurality of closed, electrically-conductive rings, each having an open center; and binder means for arranging the plurality of rings in a predetermined, fixed relationship relative to each other, the so-arranged rings and binder means defining an outer surface;

wherein electromagnetic energy received by the shield from a source adjacent its outer surface induces an electrical current to flow in a predetermined direction adjacent and parallel to the outer surface, through the plurality of rings;

and wherein each ring is configured to cause source-induced alternating current flowing through the portion of the ring closest to the outer surface to electromagnetically induce an oppositely-directed current in the portion of the ring furthest from the surface, such oppositely-directed current bucking any source-induced current in the latter ring portion and thus reducing the magnitude of current flowing through it, whereby the electromagnetic shielding effected by the shield is enhanced.

2. An electromagnetic shield as defined in claim 1, wherein;
the binder means is comprised of a non-electrically conductive material; and
the plurality of rings are distributed substantially uniformly in the binder means in a sufficiently high concentration to ensure that a majority of the rings are in electrical contact with each other.

3. An electromagnetic shield as defined in claim 2, wherein the plurality of rings are distributed in the binder means in a substantially random orientation.

4. An electromagnetic shield as defined in claim 2, wherein;
the plurality of rings are all substantially planar; and
the plurality of rings are distributed in the binder means with their planes substantially parallel to each other and perpendicular to the outer surface.

5. An electromagnetic shield as defined in claim 1, wherein the plurality of rings are all substantially circular and of substantially the same size.

6. An electromagnetic shield as defined in claim 1, wherein:
the shield is located at an interface between inner and outer conductors, the conductors being generally cylindrical and coaxial with each other, and the inside surface of the outer conductor being disposed radially outwardly from the outside surface of the inner conductor to define a uniform annular space therebetween;
the plurality of rings are all substantially planar and circular; and
the binder means arranges the plurality of rings in a generally toroidal configuration in the uniform annular space between the inner and outer coaxial conductors, with the plane of each ring aligned with the axes of the inner and outer coaxial conductors and with each ring electrically connecting together the inner and outer conductors.

7. An electromagnetic shield as defined in claim 1, wherein each ring in the plurality of rings is a segment of a structure that includes a plurality of planar, substantially circular, and substantially equal-sized rings connected to each other and having a common diameter.

8. An electromagnetic shield as defined in claim 1, wherein the plurality of rings are interlocked together to form a two-dimensional array of mail.

9. An electromagnetic shield as defined in claim 8, wherein the interlocked rings are welded together to form a substantially rigid structure.

10. An electromagnetic shield as defined in claim 8, and further including a flexible wire braid overlaying the array of interlocked rings.

11. An electromagnetic shield for shielding against electromagnetic energy at an interface between inner and outer conductors, the conductors being generally cylindrical and coaxial with each other, and the inside surface of the outer conductor being disposed radially outwardly from the outside surface of the inner conductor to define a uniform annular space therebetween, the electromagnetic shield comprising:
a plurality of substantially circular, planar, electrically-conductive rings; and
means for arranging the plurality of rings in a generally toroidal configuration in the uniform annular space between the inner and outer coaxial conductors, with the plane of each ring aligned with the axes of the inner and outer coaxial conductors, and with each ring defining an outer leg and an inner leg interconnecting the inside surface of the outer conductor and the outside surface of the inner conductor;
wherein electromagnetic energy received by the shield from an adjacent source induces electrical current to flow, with minimal impedance, axially along one of the coaxial conductors and through the outer and inner legs of the plurality of rings to the other coaxial conductor, more current flowing through the outer legs than through the inner legs,
and wherein each ring is configured to cause source-induced alternating current flowing through the outer leg of each ring to electromagnetically induce an oppositely-directed current in the inner leg of the same ring, such oppositely-directed current bucking the source-induced current in the inner leg and thereby reducing the magnitude of current in the inner leg and correspondingly enhancing the electromagnetic shielding the shield provides.

12. An electromagnetic shield as defined in claim 11, wherein the means for arranging includes a ring of compressible, non-electrically-conductive material extending through the open centers of the plurality of electrically-conductive rings.

13. An electromagnetic shield as defined in claim 11, wherein the means for arranging includes a metallic strip interconnecting the plurality of rings along one side thereof.

14. An electromagnetic shield as defined in claim 11, wherein the plurality of rings are all of the same size.

15. An electromagnetic shield as defined in claim 11, and further including means defining an annular recess in either the inside surface of the outer conductor or the outside surface of the inner conductor, for seating the plurality of rings.

16. An electromagnetic shield as defined in claim 11, and further including:
an additional plurality of substantially circular, planar, electrically-conductive rings; and
means for arranging the additional plurality of rings in a generally toroidal configuration in the uniform annular space between the inner and outer coaxial conductors, adjacent to the first plurality of rings;
wherein the plane of each ring in the additional plurality of rings is aligned with the axes of the inner and outer coaxial conductors, and wherein each ring in the additional plurality of rings defines an outer leg and an inner leg interconnecting the inside surface of the outer conductor and the outside surface of the inner conductor.

17. An electrical connector for connecting together two coaxial transmission lines, comprising;
an inner cylindrical conductor;
an outer cylindrical conductor coaxial with the inner cylindrical conductor, wherein the inside surface of the outer conductor is disposed radially outwardly from the outside surface of the inner conductor to define a uniform annular space therebetween;
a plurality of substantially circular, planar, electrically-conductive rings; and
means for arranging the plurality of rings in a generally toroidal configuration in the uniform annular space between the inner and outer coaxial conductors, with the plane of each ring aligned with the axes of the inner and outer coaxial conductors, and with each ring defining an outer leg and an inner leg interconnecting the inside surface of the outer conductor and the outside surface of the inner conductor;
wherein electromagnetic energy received by the shield from an adjacent source induces electrical current to flow, with minimal impedance, axially along one of the coaxial conductors and through the outer and inner legs of the plurality of rings to the other coaxial conductor, more current flowing through the outer legs than through the inner legs,
and wherein each ring is configured to cause source-induced alternating current flowing through the outer leg of each ring to electromagnetically induce an oppositely-directed current in the inner leg of the same ring, such oppositely-directed current bucking the source-induced current in the inner leg and thereby reducing the magnitude of current in the inner leg and correspondingly enhancing the electromagnetic shielding the connector provides.

18. An electromagnetic shield for shielding against electromagnetic energy, comprising:
first and second conductors having confronting surfaces, with a uniform space between them;
a plurality of substantially circular, planar, electrically-conductive rings; and
means for arranging the plurality of rings in a predetermined relationship in the uniform space between the confronting surfaces of the first and second conductors, with each ring defining first and second legs interconnecting the confronting surfaces, and with the plane of each ring being arranged substantially perpendicular to the surfaces at their respective points of contact;
wherein electromagnetic energy received by the shield from an adjacent source induces electrical current to flow along the first conductor and through the first and second legs of the plurality of rings to the second conductor, more current flowing through the first legs than through the second legs,
and wherein each ring is configured to cause source-induced alternating current flowing through the first leg of each ring to electromagnetically induce an oppositely-directed current in the second leg of the same ring, such oppositely-directed current bucking the source-induced current in the first leg and correspondingly enhancing the electromagnetic shielding the shield provides.

19. An electromagnetic shield as defined in claim 18, wherein:
the first and second conductors are generally cylindrical and coaxial with each other, the confronting surface of the first conductor being disposed radially outwardly from the confronting surface of the second conductor, to define a uniform annular space therebetween; and
the means for arranging includes means for arranging the plurality of rings in a generally toroidal configuration in the uniform annular space between the first and second conductors, with the plane of each ring aligned with the longitudinal axes of the first and second conductors.

* * * * *